(12) United States Patent
Chang et al.

(10) Patent No.: US 7,545,207 B2
(45) Date of Patent: *Jun. 9, 2009

(54) CONTROL CIRCUIT AND METHOD FOR A SWITCHING AMPLIFIER

(75) Inventors: Ming-Hung Chang, Jubei (TW); Fu-Yuan Chen, Alian Township, Kaohsiung County (TW)

(73) Assignee: Analog and Power Electronics Corp., Hsinchu (TW)

( * ) Notice: Subject to any disclaimer, the term of this patent is extended or adjusted under 35 U.S.C. 154(b) by 136 days.

This patent is subject to a terminal disclaimer.

(21) Appl. No.: 12/007,907

(22) Filed: Jan. 17, 2008

(65) Prior Publication Data
US 2008/0129370 A1 Jun. 5, 2008

Related U.S. Application Data

(62) Division of application No. 11/452,894, filed on Jun. 15, 2006, now Pat. No. 7,388,426.

(51) Int. Cl.
*H03F 3/38* (2006.01)

(52) U.S. Cl. .......................... 330/10; 330/251

(58) Field of Classification Search .............. 330/10, 330/146, 207 A, 251; 375/238
See application file for complete search history.

(56) References Cited

U.S. PATENT DOCUMENTS

| | | | | |
|---|---|---|---|---|
| 6,081,075 A | * | 6/2000 | Littlefield | 315/209 R |
| 6,614,297 B2 | * | 9/2003 | Score et al. | 330/10 |
| 6,998,815 B2 | * | 2/2006 | Furuki | 318/400.29 |
| 7,076,070 B2 | * | 7/2006 | Pearce et al. | 381/120 |
| 7,298,209 B1 | * | 11/2007 | Sutardja | 330/207 A |

\* cited by examiner

*Primary Examiner*—Henry K Choe
(74) *Attorney, Agent, or Firm*—Rosenberg, Klein & Lee

(57) ABSTRACT

In a control circuit and method for a high efficiency and low EMI switching amplifier, an input signal is compared with a reference signal to generate a comparison signal, and a control signal is generated in response to the comparison signal for a driver to generate an output signal. The output signal is fed back to control the slope of the reference signal in association with an initial level set for the reference signal to provide a minimum on-time period for the output signal. Alternatively, a reference value is provided to compare with the reference signal for setting a minimum on-time period for the output signal.

9 Claims, 17 Drawing Sheets

US 7,545,207 B2

CONTROL CIRCUIT AND METHOD FOR A SWITCHING AMPLIFIER

RELATED APPLICATIONS

This application is a Divisional patent application of application Ser. No. 11/452,894, filed on 15 Jun. 2006 now U.S. Pat. No. 7,388,426.

FIELD OF THE INVENTION

The present invention is related generally to a switching amplifier and more particularly, to a control circuit and method for a switching amplifier.

BACKGROUND OF THE INVENTION

Switching amplifier, also known as class-D amplifier, is advantageous in efficiency and thereby has benefits when compared to class-AB amplifier. As shown in FIG. 1, a typical switching amplifier 100' including a low-pass filter (LPF) comprises an H-bridge circuit composed of switching transistors M1, M2, M3 and M4, and a control circuit 102' in response to an input signal Vi to switch the transistors M1, M2, M3 and M4 to generate a pair of output signals OUTP and OUTN. If the switching amplifier 100' is directly connected to an inductive load 106' such as a coil-type speaker, due to the output signals OUTP and OUTN in opposite polarity, there will be a large switching current flowing through the load 106', causing severe electro-magnetic interference (EMI) problems and having the load 106' to bear significant power dissipation outside of the audio frequency band. It is thus necessary to filter out the signal component outside of the audio frequency band from the output signals OUTP and OUTN by the LPF 104' before they are applied to the load 106'. FIG. 2 shows a waveform diagram of the output signals OUTP and OUTN of the switching amplifier 100' at different-level input signal Vi's, in which waveform 108' represents the output signal OUTP and waveform 110' represents the output signal OUTN. When the input signal Vi=0, the duty cycles of the output signals OUTP and OUTN both are 50%, and when the input signal Vi>0, the duty cycle of the output signal OUTP increases, and the duty cycle of the output signal OUTN decreases. Contrarily, when the input signal Vi<0, the duty cycle of the output signal OUTP decreases and the duty cycle of the output signal OUTN increases. In other switching amplifiers, it may be the case instead that, when the input signal Vi>0, the duty cycle of the output signal OUTP is less than 50%, while the duty cycle of the output signal OUTN is greater than 50%, and when the input signal Vi<0, the duty cycle of the output signal OUTP is greater than 50% while the duty cycle of the output signal OUTN is less than 50%.

However, introducing the LPF 104' results in cost raise and efficiency drop when implementing a switching amplifier, and therefore it is proposed filterless switching amplifier. Under appropriate switching control, for instance disclosed in U.S. Pat. Nos. 6,211,728 and 6,262,632, a filterless switching amplifier may retain the advantages in efficiency. Additionally, the EMI issue is also important in the design of a filterless switching amplifier. The present invention is directed to a high efficiency and low EMI switching amplifier and a control method thereof.

SUMMARY OF THE INVENTION

An object of the present invention is to provide a control circuit and method for a high efficiency switching amplifier.

Another object of the present invention is to provide a control circuit and method for a low EMI switching amplifier.

Still another object of the present invention is to provide a control circuit and method for a filterless switching amplifier.

Yet another object of the present invention is to provide a control circuit and method for a low-cost switching amplifier.

A further object of the present invention is to provide a control circuit and method for a small-size switching amplifier.

In a switching amplifier including a driver to generate an output signal, according to the present invention, a control circuit and method comprise comparison of an input signal with a reference signal varying with the output signal to generate a comparison signal, and generation of a control signal in response to the comparison signal for the driver to generate the output signal. An initial level is set for the reference signal such that the output signal is provided with a minimum on-time period.

Alternatively, in a switching amplifier, an input signal is compared with a reference signal to generate a comparison signal and a control signal is generated in response to the reference signal, a reference value and the comparison signal for a driver of the switching amplifier to generate an output signal. The reference value sets a minimum on-time period for the output signal.

When implemented with fully-differential configuration, a switching amplifier with high efficiency and low EMI can be realized.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
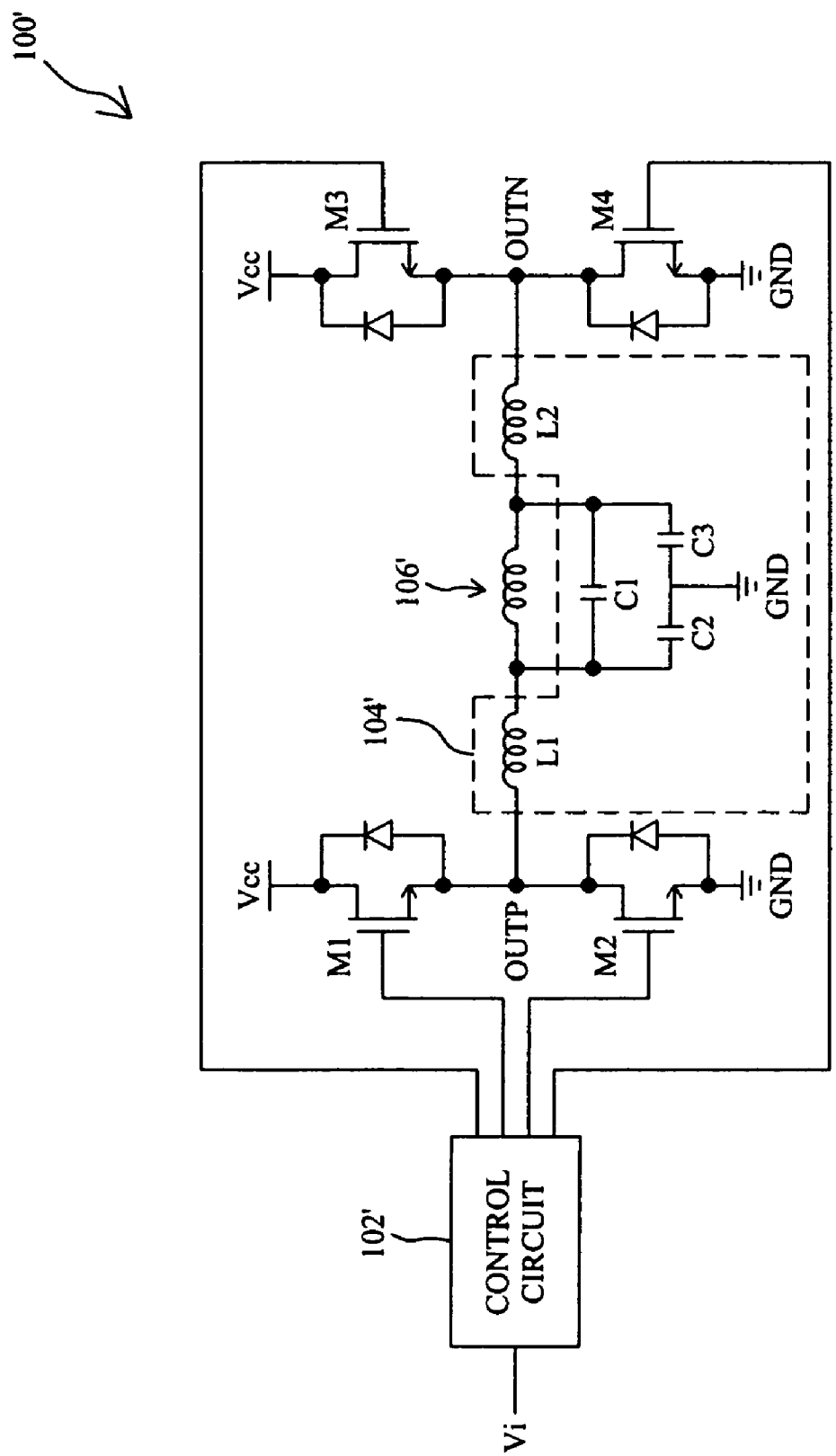
FIG. 1 shows a switching amplifier having a low-pass filter.
Figure 2:
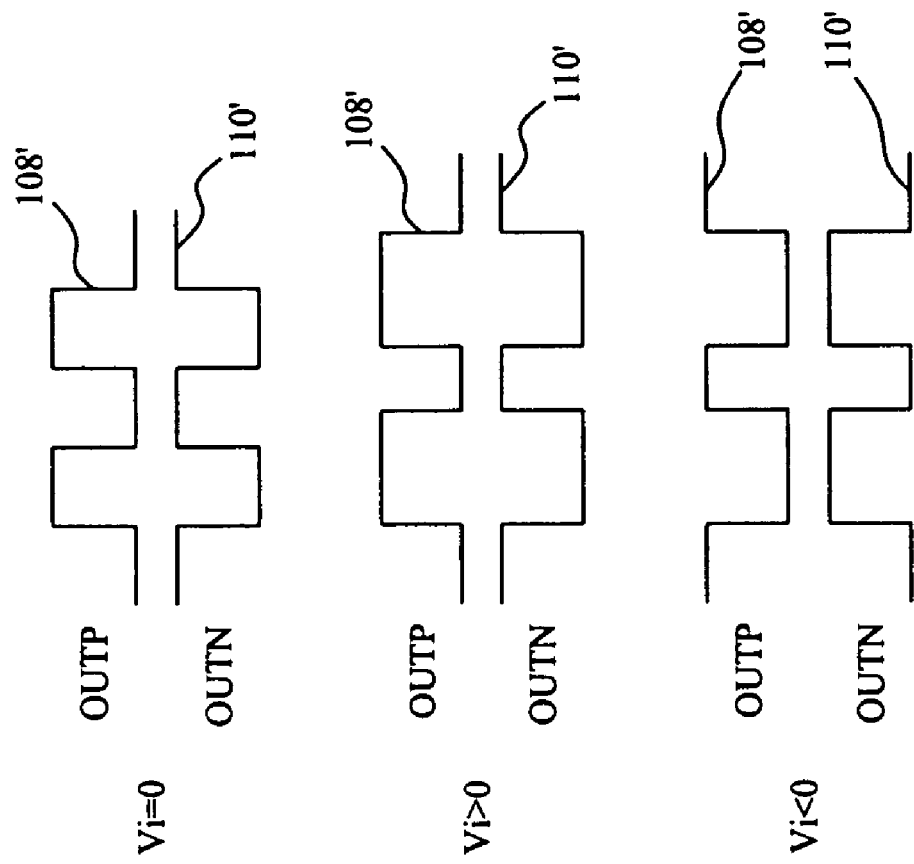
FIG. 2 shows a waveform diagram of output signals OUTP and OUTN generated by the switching amplifier of FIG. 1 at different-level input signals Vi's.
Figure 3:
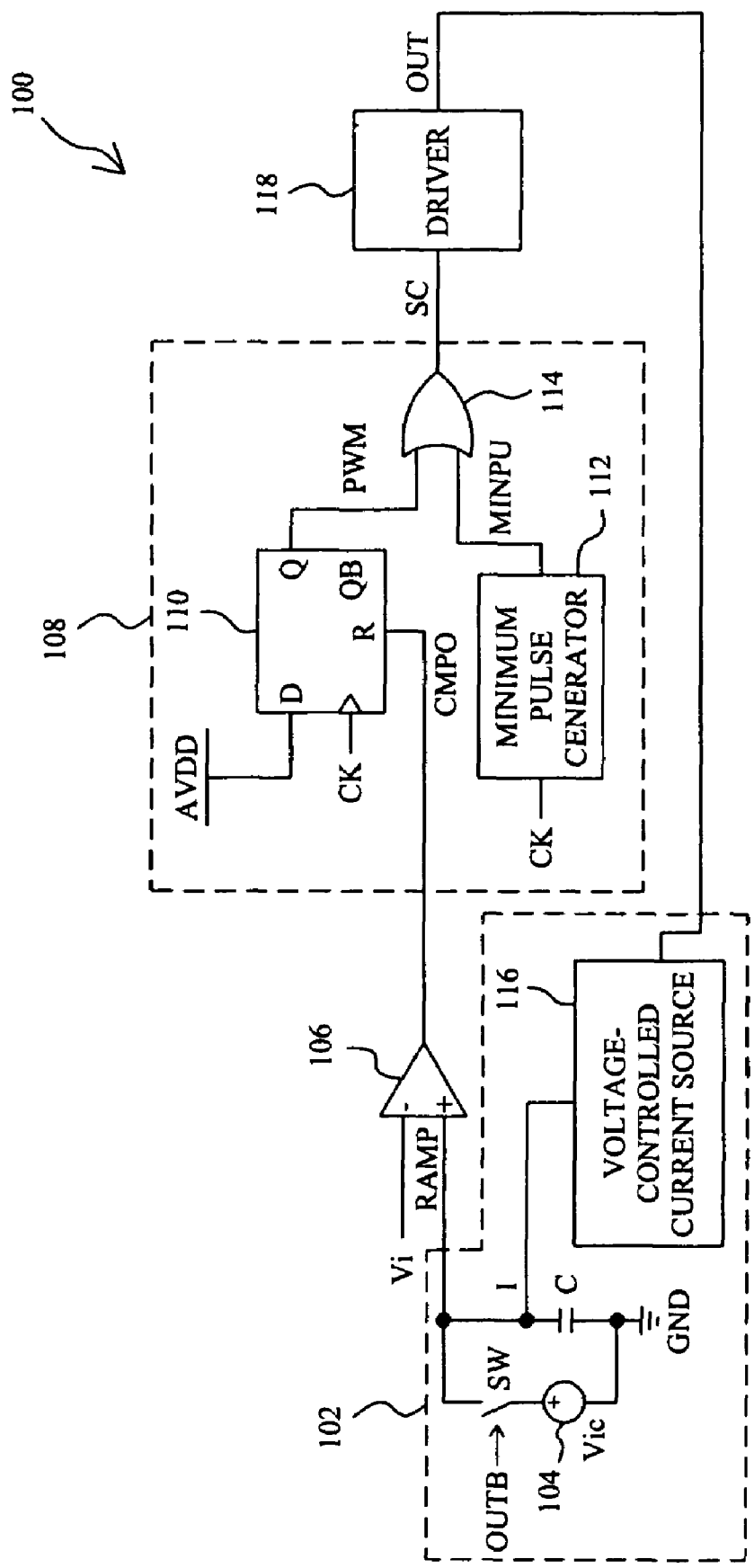
FIG. 3 shows an embodiment of control circuit according to the present invention.
Figure 4:
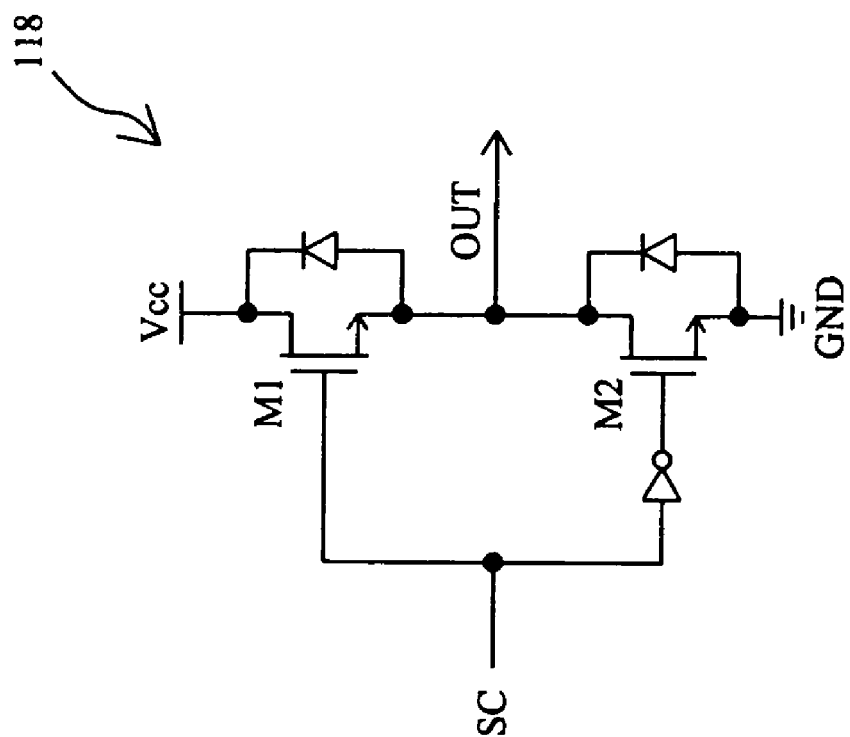
FIG. 4 shows an embodiment for the driver 118 shown in FIG. 3.

FIG. 3 shows a control circuit 100 according to the present invention, in which a reference signal generator 102 provides a reference signal RAMP for a comparator 106 to compare with an input signal Vi to generate a comparison signal CMPO, and a logic control circuit 108 in response to the comparison signal CMPO determines a control signal SC for a driver 118 to generate an output signal OUT. In the reference signal generator 102, a voltage source 104 provides a reference value Vic as the initial level of the reference signal RAMP, and a switch SW is controlled by a signal OUTB to connect the voltage source 104 to a capacitor C and to disconnect the voltage source 104 from the capacitor C such that the capacitor C is either discharged to set the reference signal RAMP to the initial level Vic or charged by a charging current I provided by a voltage-controlled current source 116 to raise up the reference signal RAMP. In the on-time period of the output signal OUT, the control signal OUTB turns off the switch SW so as to disconnect the voltage source 104 from the capacitor C, and therefore the capacitor C is charged by the charging current I, resulting in the reference signal RAMP to rise up. In the off-time period of the output signal OUT, the voltage-controlled current source 116 ceases supplying the charging current I, and the control signal OUTB turns on the switch SW to connect the voltage source 104 to the capacitor C, resulting in the capacitor C to be discharged such that the reference signal RAMP is switched back to the initial level Vic. In the logic control circuit 108, a flip-flop 110 generates a pulse width modulation (PWM) signal in response to a supply voltage AVDD, a clock CK and the comparison signal CMPO, and an OR gate 114 determines the control signal SC in response to the PWM signal and a minimum pulse signal MINPU provided by a minimum pulse generator 112. When the reference signal RAMP is equal to or higher than the input signal Vi, the output CMPO of the comparator 106 resets the flip-flop 110 to trigger the PWM signal to transit to low level. FIG. 4 shows an embodiment for the driver 118, which comprises two switching transistors M1 and M2 connected in series between a supply voltage Vcc and ground GND to be alternatively switched to generate the output signal OUT. Since this embodiment utilizes the output signal OUT to control the slope of the reference signal RAMP, even though the output signal OUT drifts upward because of some unwanted reason, such as noise, the average voltage level of the output signal OUT in a cycle will be still maintained in such a manner that, the slope of the reference signal RAMP follows the increased output signal OUT to increase, causing the reference signal to reach the input signal Vi earlier and thereby the on-time period to be shorter. In contrast, if the output signal OUT drifts downward, the slope of the reference signal RAMP will also decrease, causing the reference signal RAMP to reach the input signal Vi later and thereby the on-time period to be longer, so that the average voltage level of the output signal OUT in a cycle remains the same. Therefore, this control can instantly correct the distortion resulted from the level drifting of the output signal OUT.

Figure 5:
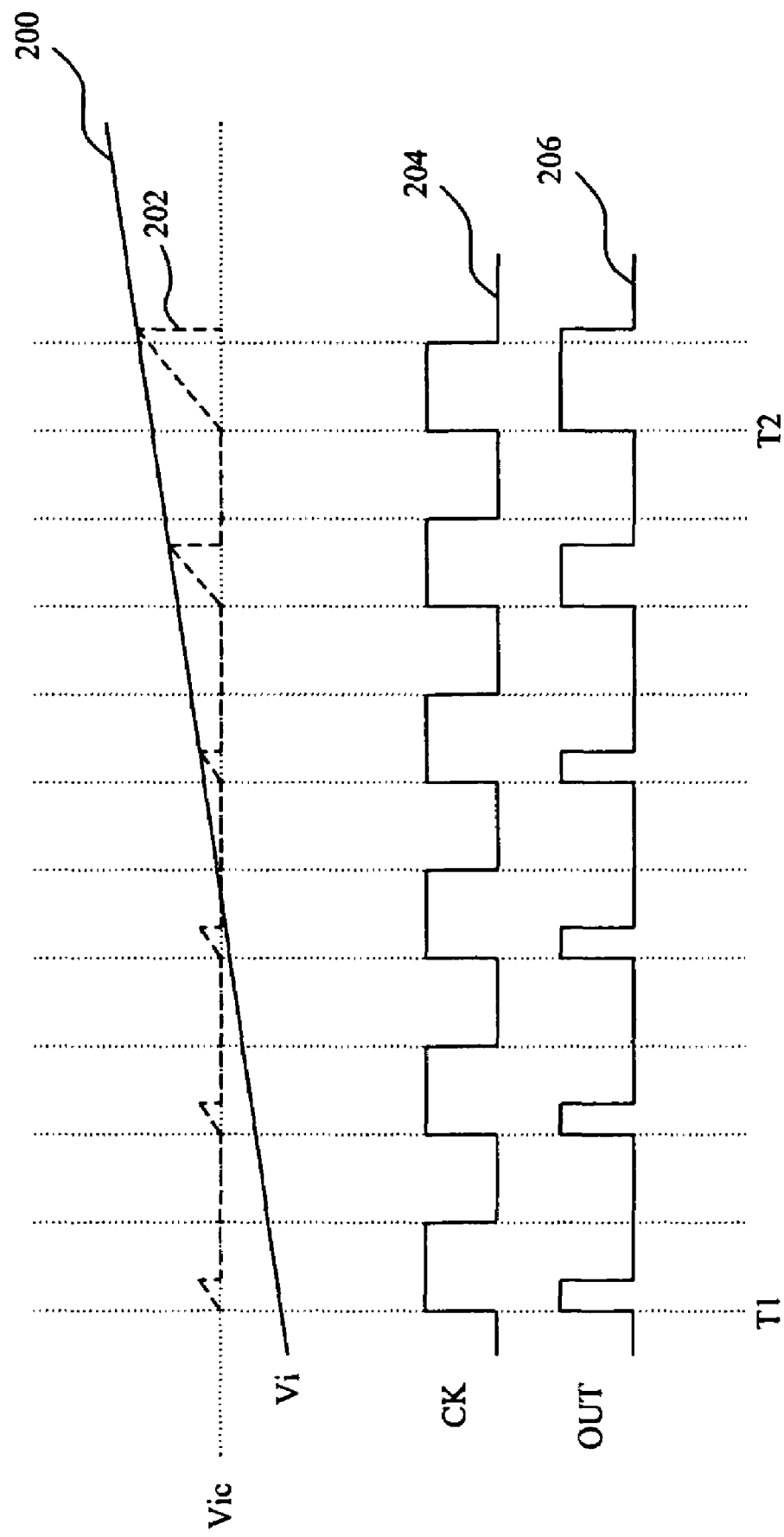
FIG. 5 shows a waveform diagram of various signals in the circuit of FIG. 3 when the input signal has a minimum lower than the initial level of the reference signal.

FIG. 5 shows a waveform diagram of various signals in the circuit shown in FIG. 3 when the minimum of the input signal Vi is lower than the reference value Vic, in which waveform 200 represents the input signal Vi, waveform 202 represents the reference signal RAMP, waveform 204 represents the clock CK, and waveform 206 represents the output signal OUT. Referring to FIG. 3 and FIG. 5, if the input signal Vi is lower than the reference value Vic at the time the clock CK transits from low level to high level, for example as indicated by time T1, the output CMPO of the comparator 106 will be high level, thereby resetting the flip-flop 110 to keep the PWM signal at low level, so that the control signal SC is substantially the minimum pulse signal MINPU, which ensures that the output signal OUT has a narrow square waveform. If the input signal Vi is higher than the reference value Vic at the time the clock CK transits from low level to high level, for example as indicated by time T2, the output CMPO of the comparator 106 will be low level, and thus the flip-flop 110 will maintain the PWM signal at high level, which overrides the minimum pulse signal MINPU to be the control signal SC. Until the reference signal RAMP reaches the input signal Vi, the output CMPO of the comparator 106 transits to high level, thereby resetting the flip-flop 110, so that the PWM signal and thereby the control signal SC and output OUT transit to low level.

Figure 6:
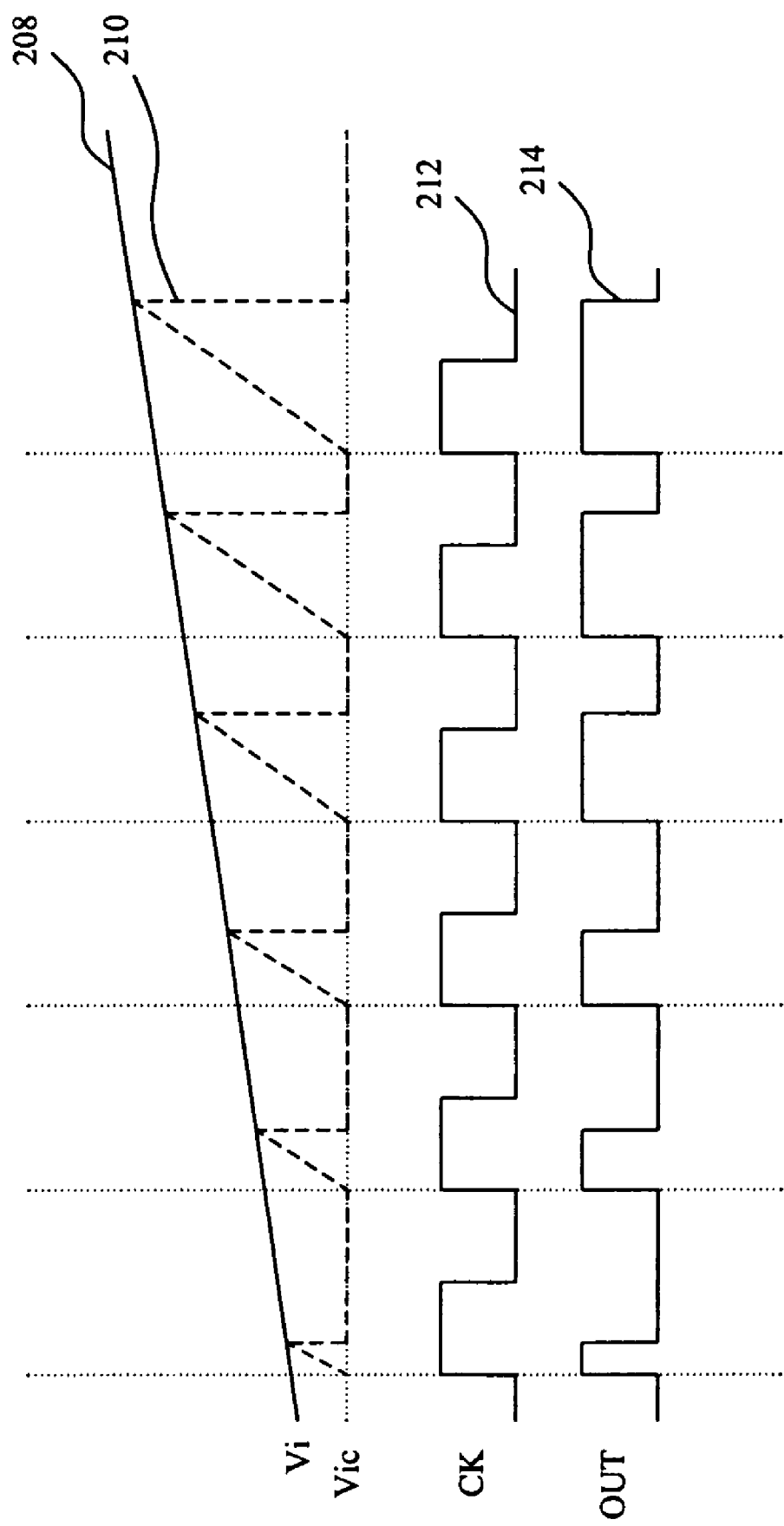
FIG. 6 shows a waveform diagram of various signals in the circuit of FIG. 3 when the input signal has a minimum higher than the initial level of the reference signal.

FIG. 6 shows a waveform diagram of various signals in the circuit shown in FIG. 3 when the minimum of the input signal Vi is higher than the reference value Vic, in which waveform 208 represents the input signal Vi, waveform 210 represents the reference signal RAMP, waveform 212 represents the clock CK, and waveform 214 represents the output signal OUT. Referring to FIG. 3 and FIG. 6, each time the clock CK transits from low level to high level, it triggers the flip-flop 110 to produce the PWM signal to be high level, and the output signal OUT is high level accordingly. In response to the output signal OUT, the control signal OUTB turns off the switch SW and the voltage-controlled current source 116 generates the charging current I to charge the capacitor C, causing the reference signal RAMP to rise up from the initial level Vic. Once the reference signal RAMP reaches the input signal Vi, the output CMPO of the comparator 106 resets the flip-flop 110 and thereby the PWM signal, control signal SC and output signal OUT, and at the same time the switch SW is turned on by the control signal OUTB to discharge the capacitor C, causing the reference signal RAMP back to the initial level Vic.

Figure 7:
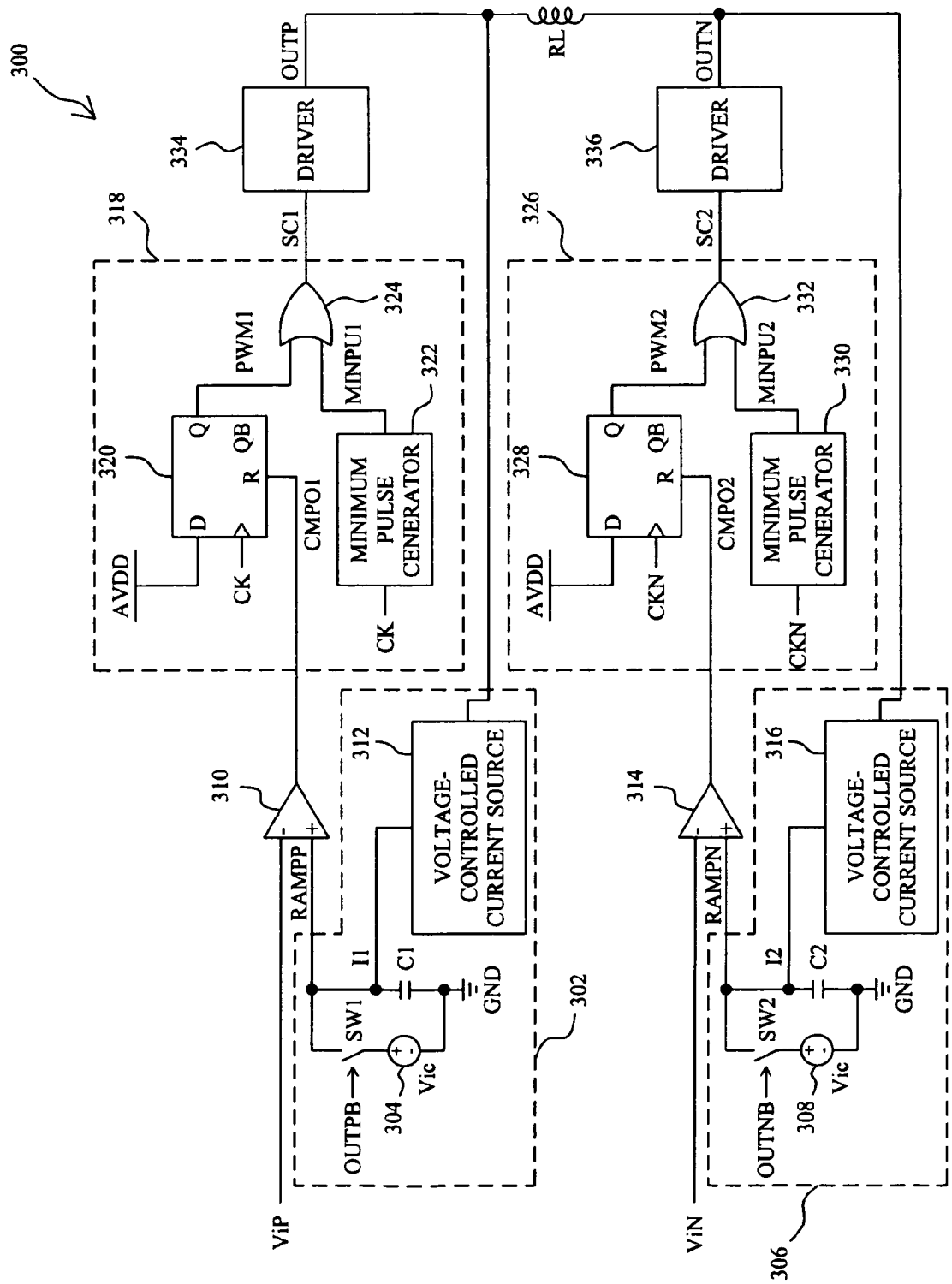
FIG. 7 shows a switching amplifier using the control circuit shown in FIG. 3.
Figure 8:
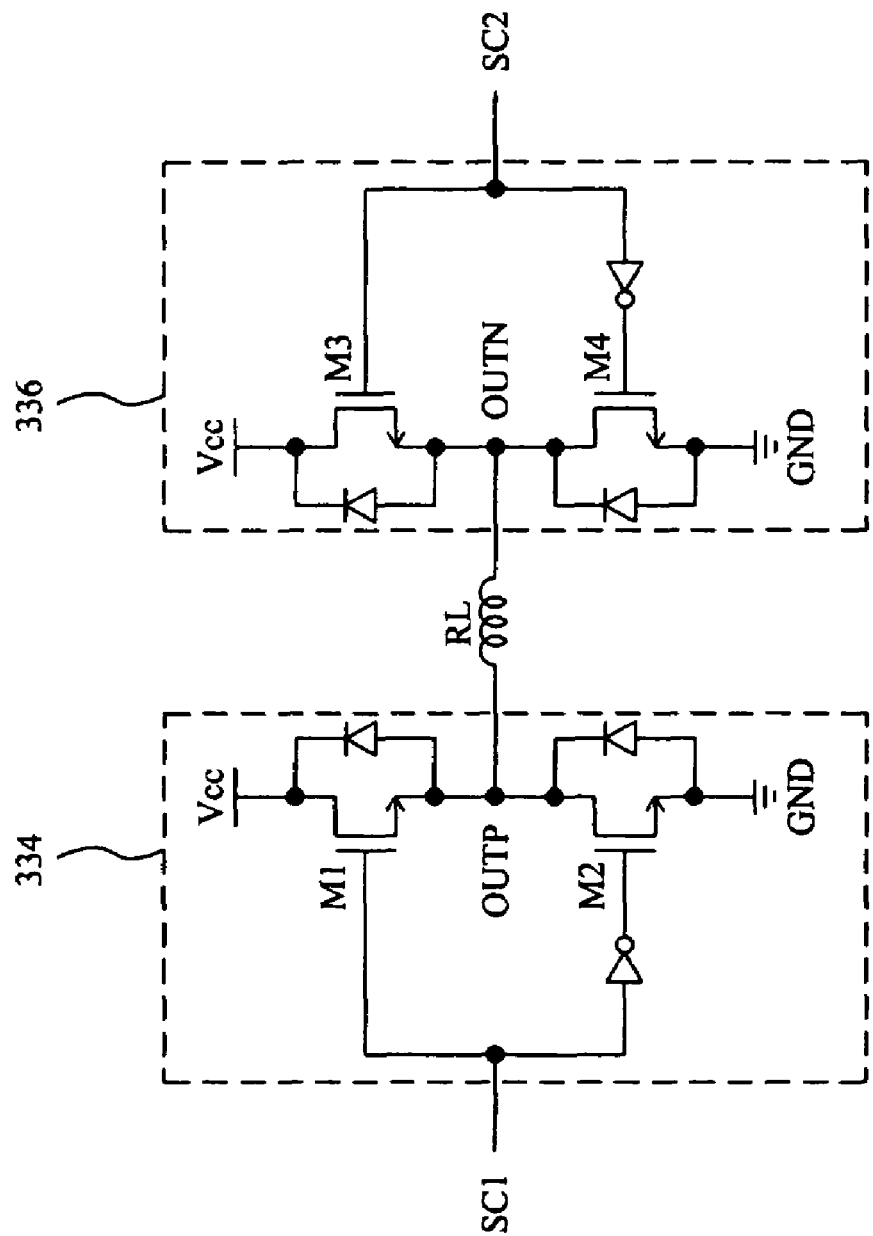
FIG. 8 shows an embodiment for the drivers 334 and 336 shown in FIG. 7.

FIG. 7 shows a switching amplifier using the control circuit 100 shown in FIG. 3. In a control circuit 300, input signals ViP and ViN are 180-degree out of phase and connected to comparator 310 and 314, respectively, a reference signal generator 302 comprises a voltage-controlled current source 312 to generate a charging current I1 in response to an output signal OUTP in order to charge a capacitor C1 to generate a reference signal RAMPP for the comparator 310, a voltage source 304 to provide a reference value Vic as the initial level of the reference signal RAMPP, and a switch SW1 controlled by a signal OUTPB to control charging and discharging the capacitor C1, the comparator 310 compares the input signal ViP with the reference signal RAMPP to produce a comparison signal CMPO1, a logic control circuit 318 comprises a flip-flop 320 to generate a PWM signal PWM1 in response to a supply voltage AVDD, a clock CK and the comparison signal CMPO1, and an OR gate 324 to produce a control signal SC1 in response to the signal PWM1 and a minimum pulse signal MINPU1 provided by a minimum pulse generator 322 for a driver 334 to generate the output signal OUTP, a reference signal generator 306 comprises a voltage-controlled current source 316 to generate a charging current I2 in response to an output signal OUTN in order to charge a capacitor C2 to generate a reference signal RAMPN, a voltage source 308 to provide a reference value Vic as the initial level of the reference signal RAMPN, and a switch SW2 controlled by a signal OUTNB to control charging and discharging the capacitor C2, the comparator 314 compares the input signal ViN with the reference signal RAMPN to produce a comparison signal CMPO2, a logic control circuit 326 comprises a flip-flop 328 to generate a PWM signal PWM2 in response to a supply voltage AVDD, a clock CKN and the comparison signal CMPO2, and an OR gate 332 to produce a control signal SC2 in response to the signal PWM2 and a minimum pulse signal MINPU2 provided by a minimum pulse generator 330 for a driver 336 to generate an output signal OUTN, and the drivers 334 and 336 constitute an H-bridge circuit, for example shown in FIG. 8, to couple with an inductive load RL. As shown in FIG. 8, the driver 334 comprises switching transistors M1 and M2 connected in series between a supply voltage Vcc and ground GND, alternatively switched by the control signal SC1 to generate the output signal OUTP, and the driver 336 comprises switching transistors M3 and M4 connected in series between the supply voltage Vcc and ground GND, alternatively switched by the control signal SC2 to generate the output signal OUTN.

Figure 9:
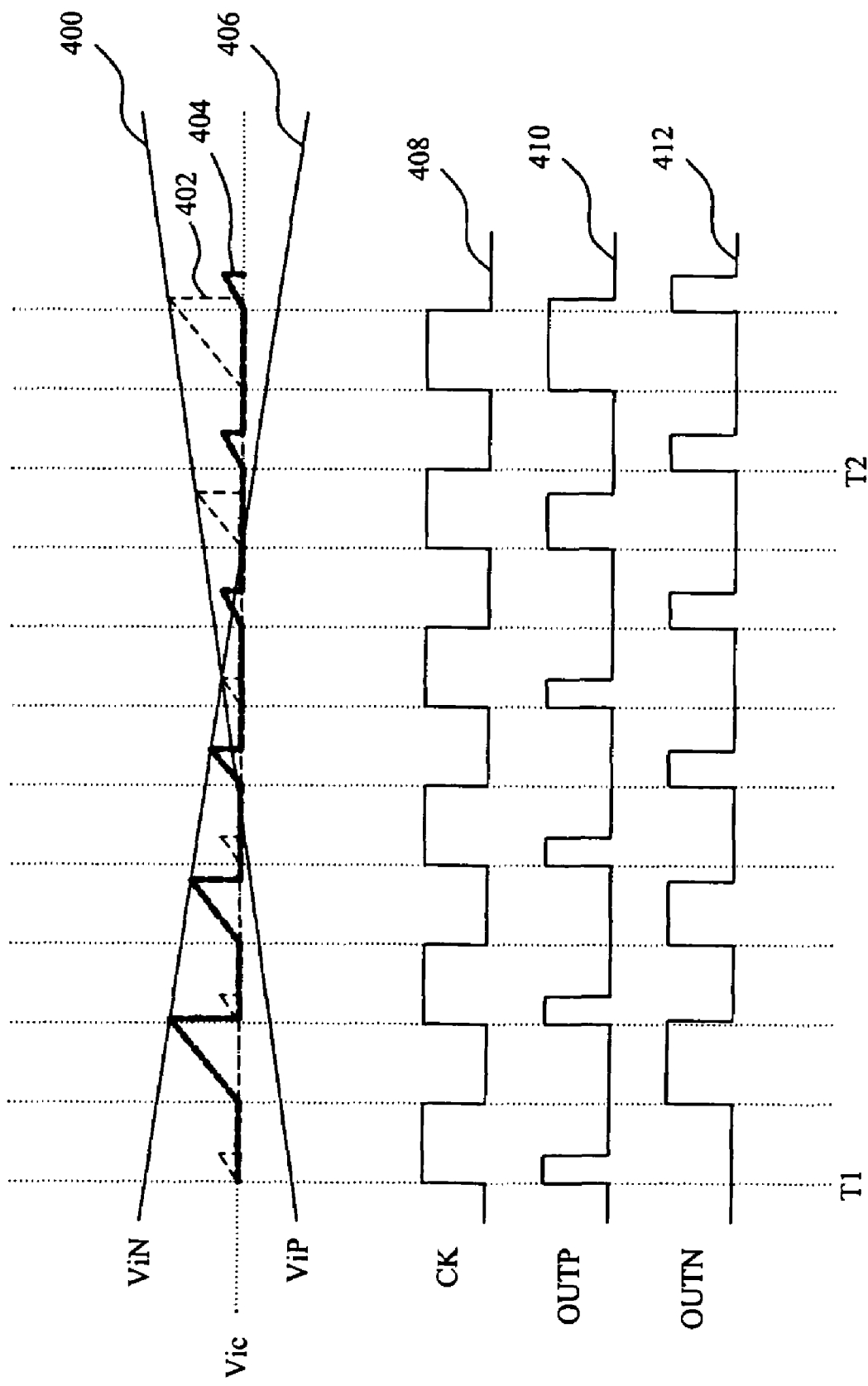
FIG. 9 shows a waveform diagram of various signals in the circuit of FIG. 7 when the input signals have a minimum lower than the initial level of the reference signal.

FIG. 9 shows a waveform diagram of various signals in the circuit shown in FIG. 7 when both the minimums of the input signals ViP and ViN are lower than the reference value Vic, in which waveform 400 represents the input signal ViP, waveform 402 represents the reference signal RAMPP, waveform 404 represents the reference signal RAMPN, waveform 406 represents the input signal ViN, waveform 408 represents the clock CK, waveform 410 represents the output signal OUTP, and waveform 412 represents the output signal OUTN. The clocks CK and CKN in this embodiment are complementary to each other. Referring to FIG. 7 and FIG. 9, if the input signal ViP is lower than the reference value Vic at the time the clock CK transits from low level to high level, for example as indicated by time T1, the output CMPO1 of the comparator 310 will be high level and reset the flip-flop 320 to keep the signal PWM1 at low level, and thus the control signal SC1 will be substantially the minimum pulse signal MINPU1, causing the output signal OUTP to have a narrow square waveform. Similarly, if the input signal ViN is lower than the reference value Vic at the time the clock CKN transits from low level to high level, i.e., the clock CK transits from high level to low level, for example as indicated by time T2, the output CMPO2 of the comparator 314 will be high level and reset the flip-flop 328 to keep the signal PWM2 at low level, and thus the control signal SC2 will be substantially the minimum pulse signal MINPU2, causing the output signal OUTN to have a narrow square waveform. In this embodiment, during the interval that the input signal ViP is lower than the input signal ViN, the output signal OUTP remains the narrow square waveform, while the on-time period of the output signal OUTN increases and decreases with the rising and falling of the input signal ViN, and during the interval that the input signal ViN is low than the input signal ViP, the output signal OUTN remains the narrow square waveform, while the on-time period of the output signal OUTP increases and decreases with the rising and falling of the input signal ViP.

Figure 10:
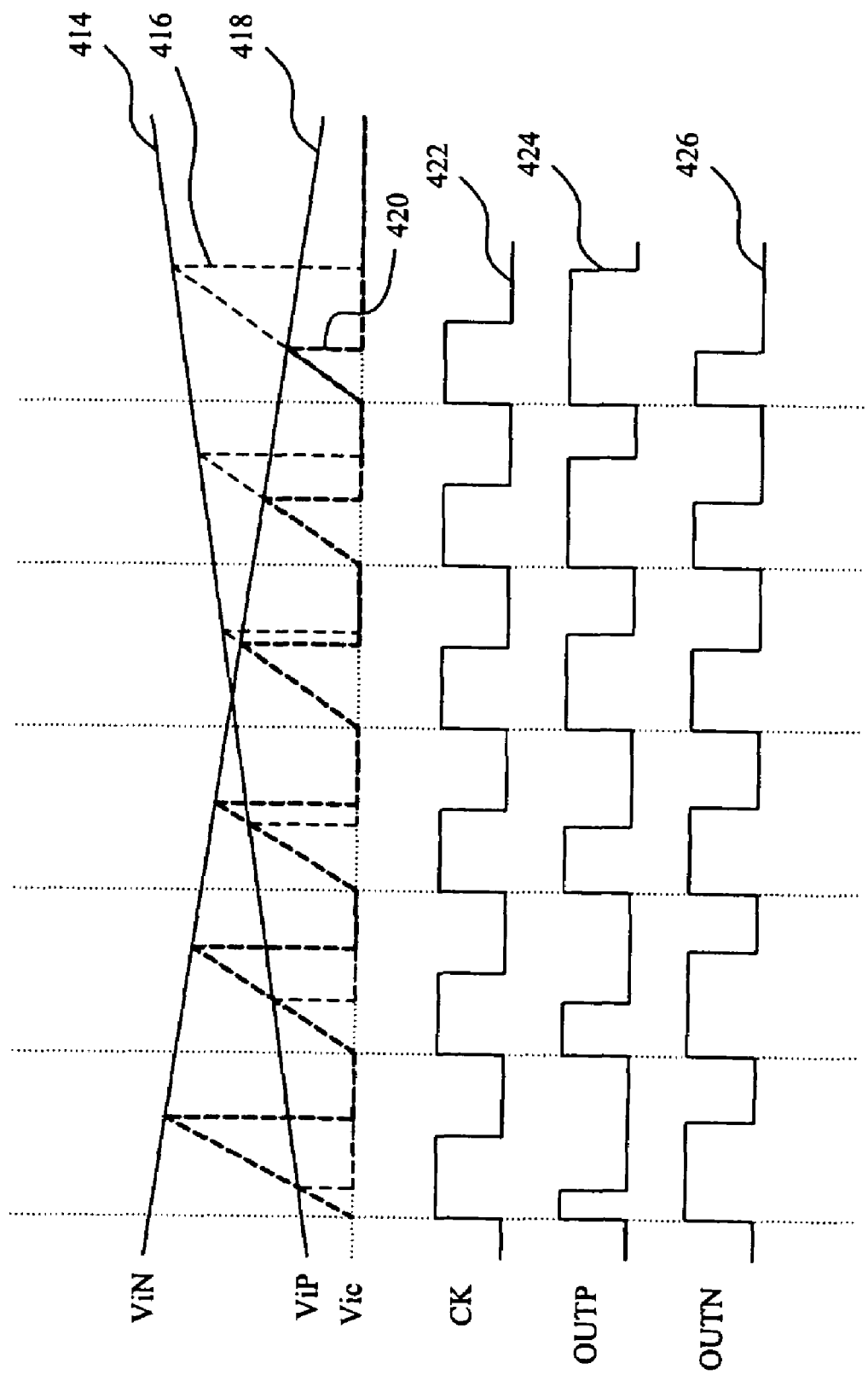
FIG. 10 shows a waveform diagram of various signals in the circuit of FIG. 7 when the input signals have a minimum higher than the initial level of the reference signal.

FIG. 10 shows a waveform diagram of various signals in the circuit shown in FIG. 7 when both the minimums of the input signal ViP and ViN are higher than the reference value Vic, in which waveform 414 represents the input signal ViP, waveform 416 represents the reference signal RAMPP, waveform 418 represents the input signal ViN, waveform 420 represents the reference signal RAMPN, waveform 422 represents the clock CK, waveform 424 represents the output signal OUTP, and waveform 426 represents the output signal OUTN. In this embodiment, the clocks CK and CKN are the same. Referring to FIG. 7 and FIG. 10, each time the clock CK transits from low level to high level, the flip-flops 320 and 328 are triggered to produce the signals PWM1 and PWM2 at high level, the output signals OUTP and OUTN are high level accordingly, and in response thereto, the voltage-controlled current sources 312 and 316 generate the charging currents I1 and I2 to charge the capacitors C1 and C2, respectively, to cause the reference signals RAMPP and RAMPN to rise up. When the reference signals RAMPP and RAMPN reach the input signals ViP and ViN, respectively, the comparison signals CMPO1 and CMPO2 reset the respective flip-flops 320 and 328 and thereby the signals PWM1 and PWM2, control signals SC1 and SC2 and output signals OUTP and OUTN, and the control signals OUTPB and OUTNB turn on the respective switches SW1 and SW2 to discharge the capacitors C1 and C2, thereby causing the reference signals RAMPP and RAMPN back to the initial level Vic. It is also shown by this embodiment that the control circuit and method of the present invention can achieve the efficiency of the conventional filterless switching amplifier.

Figure 11:
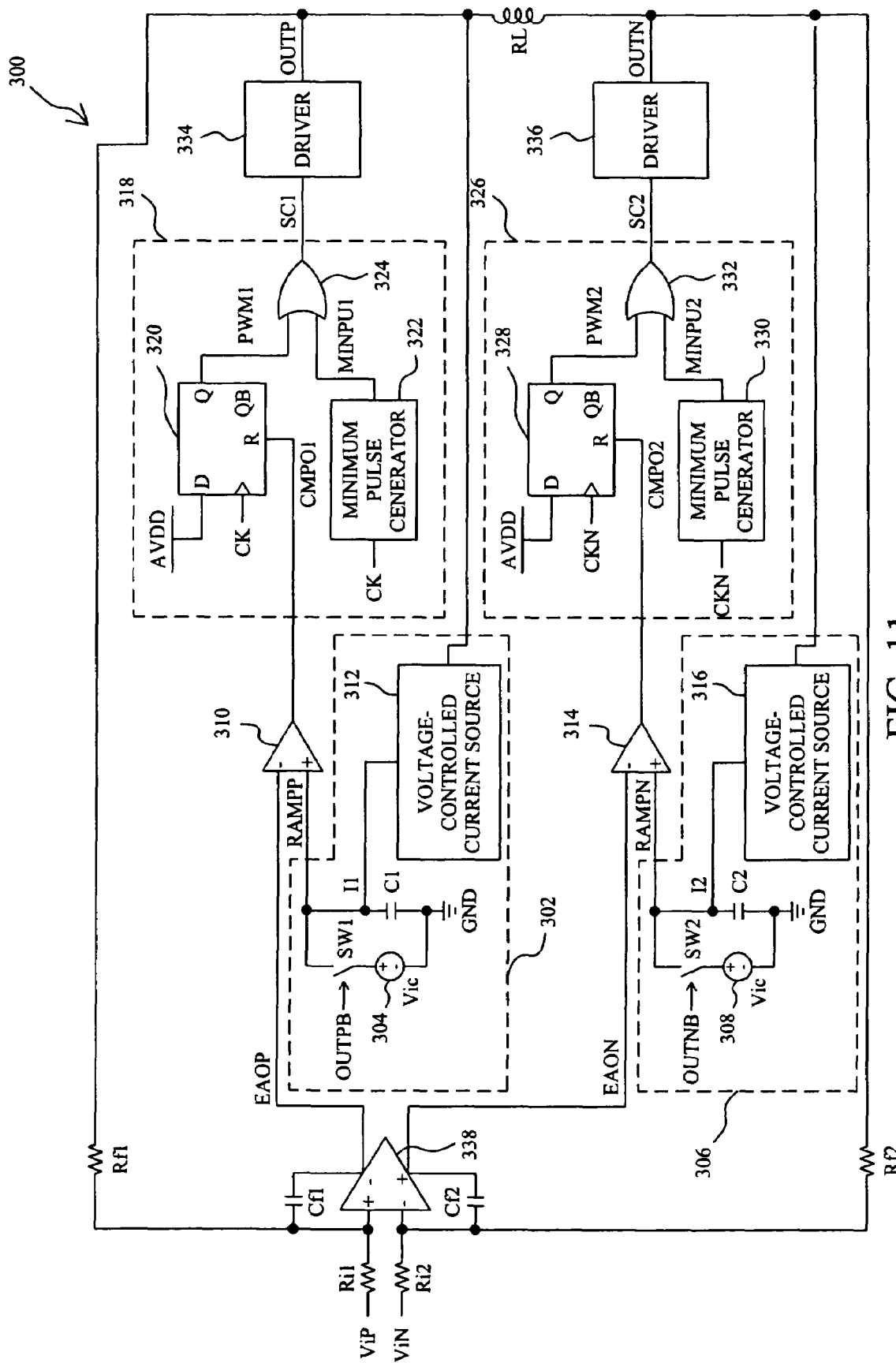
FIG. 11 shows a switching amplifier using the control circuit shown in FIG. 7 in association with negative-feedback configuration.

In other embodiments, in order to reduce distortion, a fully-differential error amplifier 338 can be inserted between the pair of input signals ViP and ViN and the pair of comparators 310 and 314, as shown in FIG. 11, to form a negative-feedback configuration. In this embodiment, a resistor Ri1 is connected between the input signal ViP and the non-inverting input of the error amplifier 338, a resistor Ri2 is connected between the input signal ViN and the inverting input of the error amplifier 338, a capacitor Cf1 is connected between the non-inverting input and negative output of the error amplifier 338, a capacitor Cf2 is connected between the inverting input and positive output of the error amplifier 338, a resistor Rf1 is connected between the output signal OUTP and the non-inverting input of the error amplifier 338, and a resistor Rf2 is connected between the output signal OUTN and the inverting input of the error amplifier 338. The error amplifier 338 generates signals EAOP and EAON for the comparators 310 and 314 in response to the difference between the signals ViP and OUTP and the difference between the signals ViN and OUTN.

Figure 12:
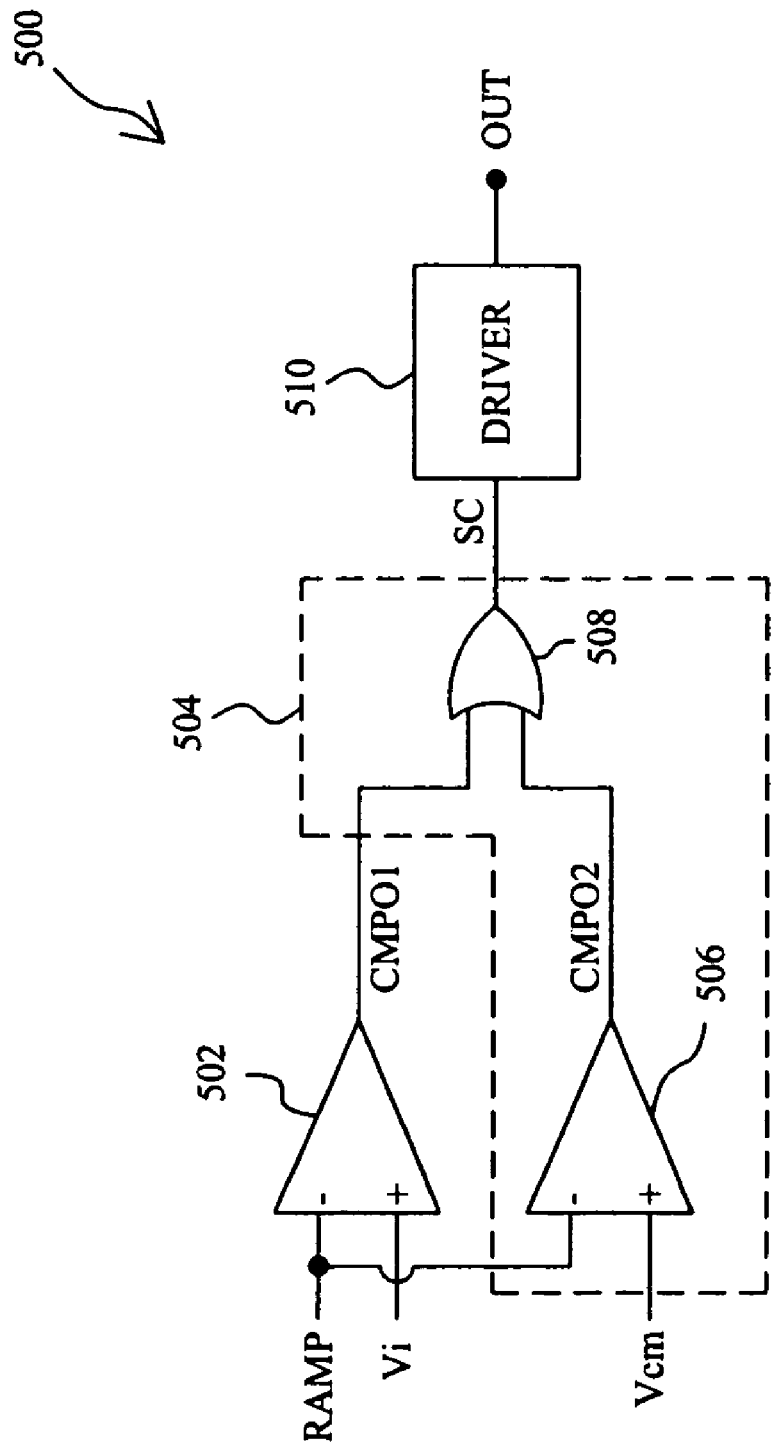
FIG. 12 shows another embodiment of control circuit according to the present invention.

FIG. 12 show another control circuit 500 according to the present invention, in which a comparator 502 compares an input signal Vi with a reference signal RAMP to produce a comparison signal CMPO1, and a logic control circuit 504 generates a control signal SC in response to the comparison signal CMPO1, the reference signal RAMP and a reference value Vcm for a driver 501 to generate an output signal OUT. FIG. 4 can be referred to for the driver 510. In the logic control circuit 504, a comparator 506 compares the reference signal RAMP with the reference value Vcm to produce a comparison signal CMPO2, ensuring by an OR gate 508 in response to the comparison signals CMPO1 and CMPO2 that the output signal OUT will have a narrow square waveform when the input signal Vi is lower than the reference signal RAMP. In this embodiment, the reference signal RAMP can have either a sawtooth waveform or a triangular waveform.

Figure 13:
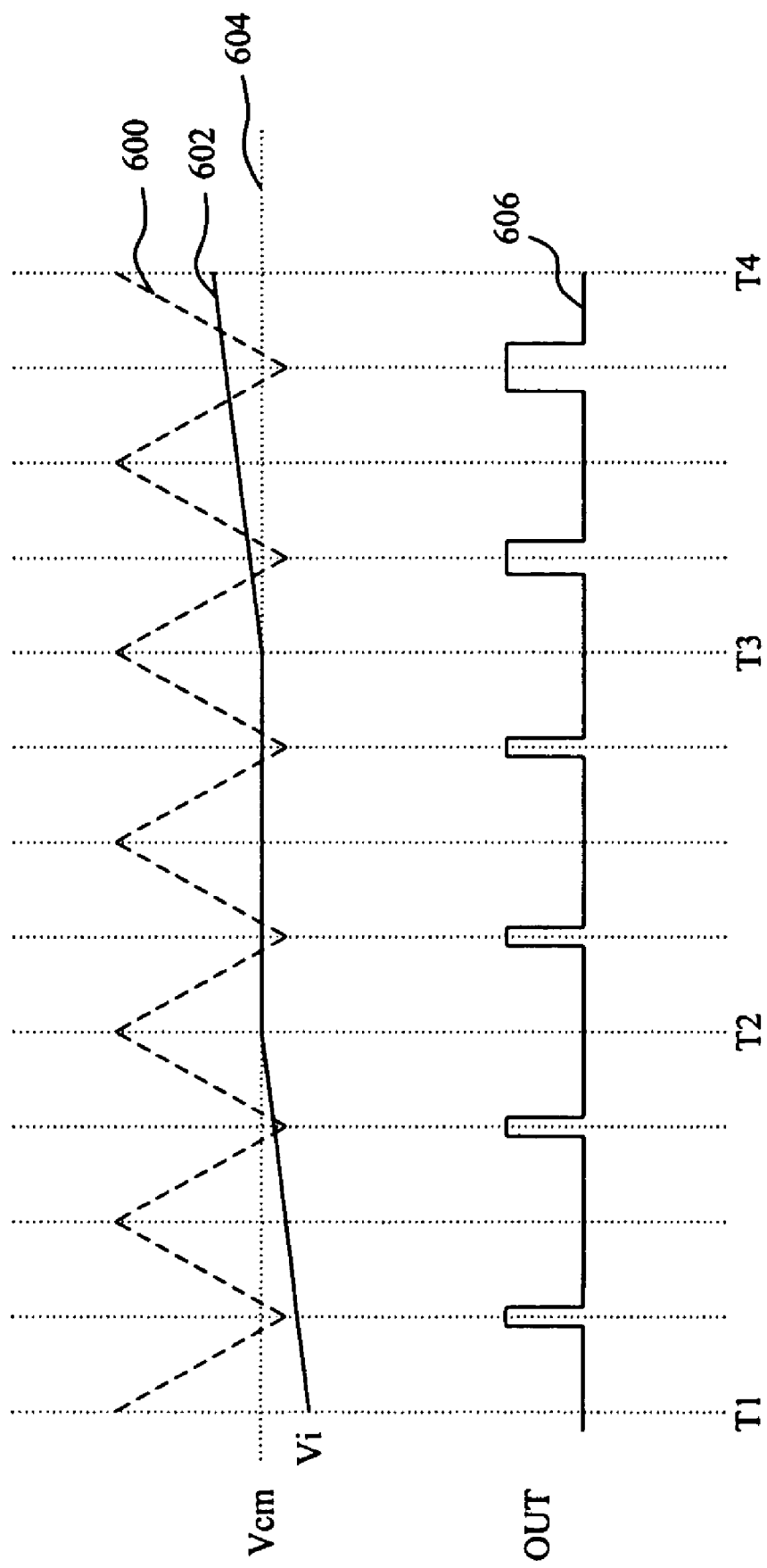
FIG. 13 shows a waveform diagram of various signals in the circuit of FIG. 12.

FIG. 13 shows a waveform diagram of various signals in the circuit shown in FIG. 12, in which waveform 600 represents the reference signal RAMP, waveform 602 represents the input signal Vi, waveform 604 represents the reference value Vcm, and waveform 606 represents the output signal OUT. Referring to FIG. 12 and FIG. 13, during the interval when the input signal Vi is lower than or equal to the reference value Vcm, as that from time T1 to time T3, the on-time period of the comparison signal CMPO1 is shorter than or equal to that of the comparison signal CMPO2, and thus the output signal OUT is substantially the comparison signal CMPO2. During the interval when the input signal Vi is higher than the reference value Vcm, as that from time T3 to time T4, the on-time period of the comparison signal CMPO1 is longer than that of the comparison signal CMPO2, thus the output signal OUT is substantially the comparison signal CMPO1, and the on-time period of the output signal OUT will increase and decrease with the rising and falling of the input signal Vi.

Figure 14:
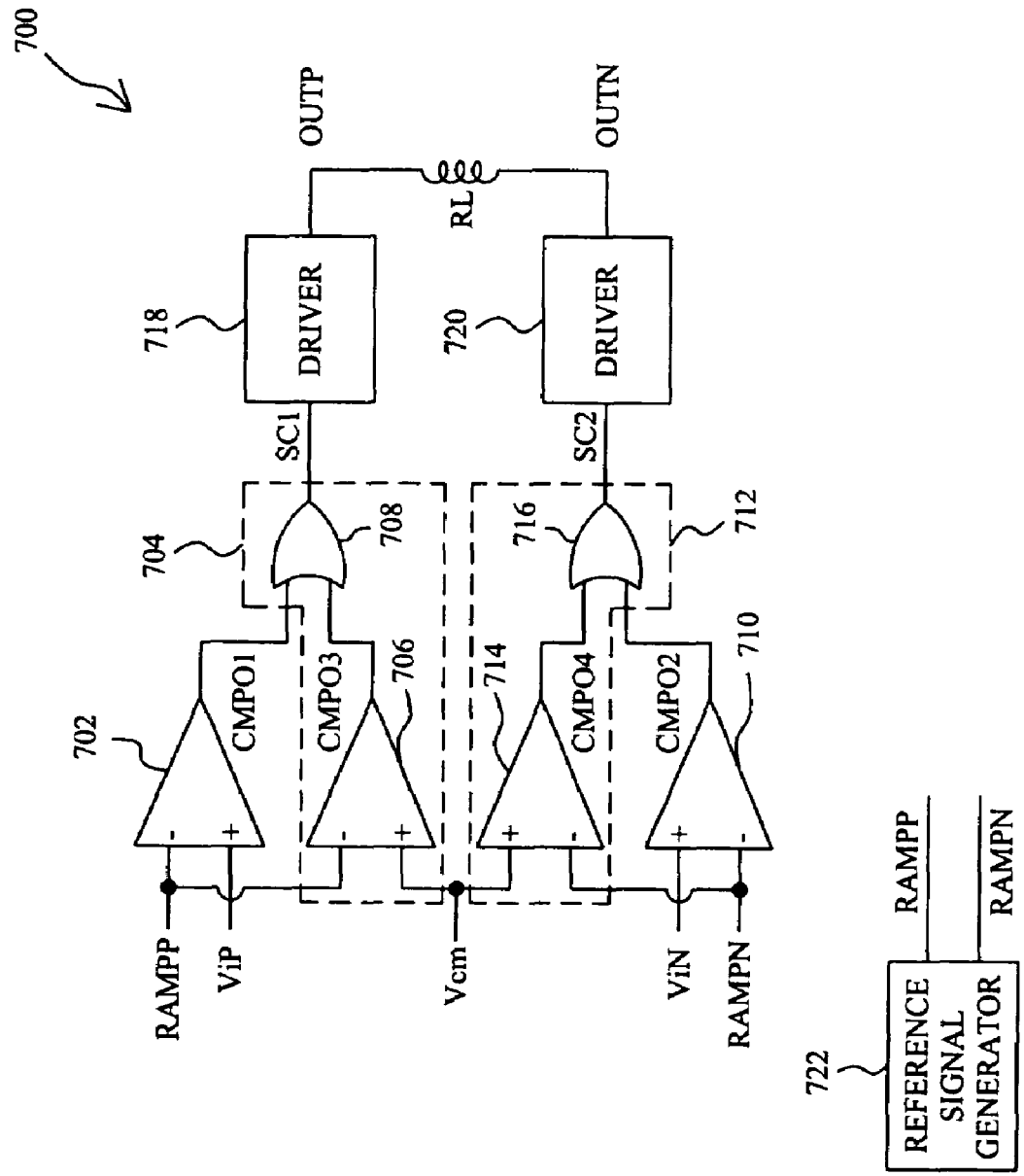
FIG. 14 shows a switching amplifier using the control circuit shown in FIG. 12.

FIG. 14 shows a switching amplifier using the control circuit 500 shown in FIG. 12. In a control circuit 700, the input signals ViP and ViN are 180-degree out of phase and connected to comparators 702 and 710, respectively, a reference signal generator 722 supplies reference signals RAMPP and RAMPN for the comparators 702 and 710, the comparator 702 compares the input signal ViP with the reference signal RAMPP to generate a comparison signal CMPO1, a logic control circuit 704 generates a control signal SC1 in response to the comparison signal CMPO1, the reference signal RAMPP and a reference value Vcm for a driver 718 to generate an output signal OUTP, a comparator 710 compares the input signal ViN with the reference signal RAMPN to generate a comparison signal CMPO2, and a logic control circuit 712 generates a control signal SC2 in response to the comparison signal CMPO2, reference signal RAMPN and reference value Vcm for a driver 720 to generate an output signal OUTN. In the logic control circuit 704, the comparator 706 compares the reference signal RAMPP with the reference value Vcm to generate a comparison signal CMPO3, so as to ensure that the output signal OUTP will have a narrow square waveform when the input signal ViP is lower than the reference signal RAMPP, by using an OR gate 708 to generate the control signal SC1 in response to the comparison signals CMPO1 and CMPO3. The reference value Vcm can be the average of the input signals ViP and ViN. In the logic control circuit 712, the comparator 714 compares the reference signal RAMPN with the reference value Vcm to generate a comparison signal CMPO4, so as to ensure that the output signal OUTN will have a narrow square waveform when the input signal ViN is lower than the reference signal RAMPN, by using an OR gate 716 to generate the control signal SC2 in response to the comparison signals CMPO2 and CMPO4. The drivers 718 and 720 constitute an H-bridge circuit to couple with an inductive load RL, and the reference signals RAMPP and RAMPN can have a sawtooth waveform, a triangular waveform or an asymmetric triangular wave.

Figure 15:
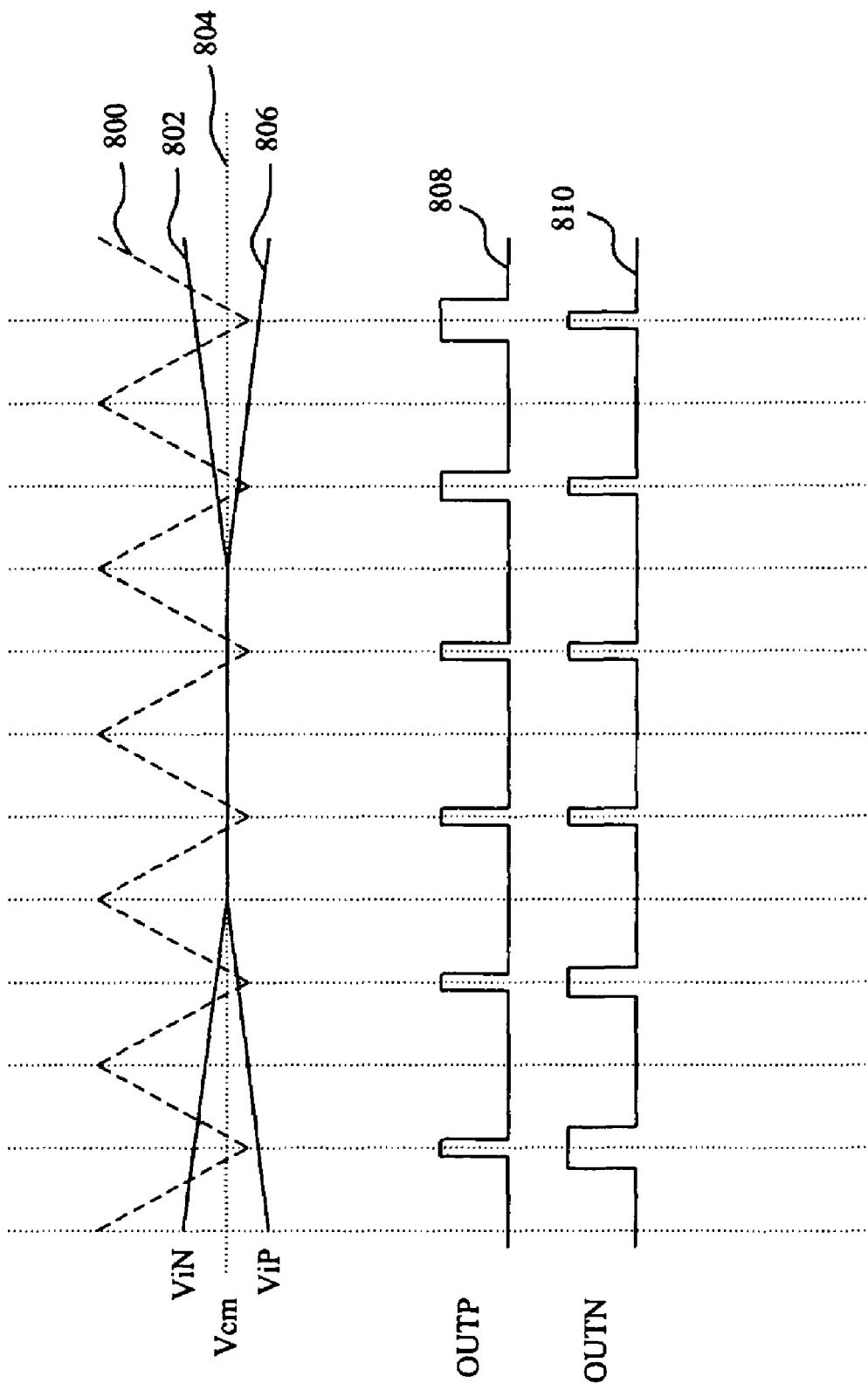
FIG. 15 shows a waveform diagram of various signals in the circuit of FIG. 14 having the reference signals in phase.
Figure 16:
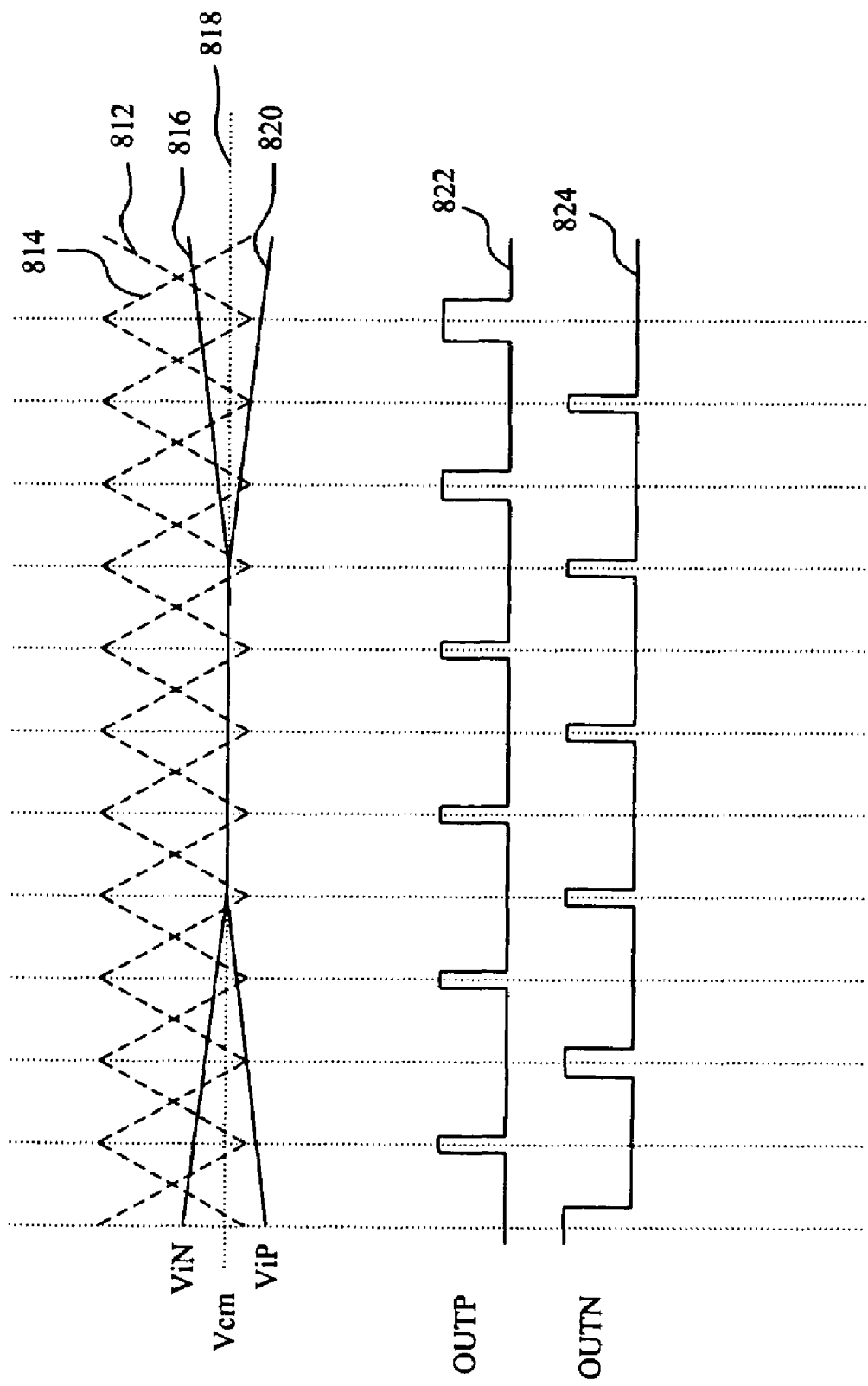
FIG. 16 shows a waveform diagram of various signals in the circuit of FIG. 14 having the reference signals out of phase.

FIGS. 15 and 16 show waveform diagrams of various signals in the circuit shown in FIG. 14. In FIG. 15, waveform 800 represents the reference signals RAMPP and RAMPN, waveform 802 represents the input signal ViP, waveform 804 represents the reference value Vcm, waveform 806 represents the input signal ViN, waveform 808 represents the output signal OUTP, and waveform 810 represents the output signal OUTN. In this embodiment, the reference signals RAMPP and RAMPN are in phase and both have a portion lower than the reference value Vcm to ensure that the output signals OUTP and OUTN will have a narrow square waveform. In FIG. 16, waveform 812 represents the reference signals RAMPP, waveform 814 represents the reference signal RAMPN, waveform 816 represents the input signal ViP, waveform 818 represents the reference value Vcm, waveform 820 represents the input signal ViN, waveform 822 represents the output signal OUTP, and waveform 824 represents the output signal OUTN. In this embodiment, the reference signals RAMPP and RAMPN are out of phase and both have a portion lower than the reference value Vcm to ensure that the output signals OUTP and OUTN will have a narrow square waveform. In other embodiments, the phase difference between the output signals OUTP and OUTN may be anywhere from 0 to 180 degrees.

Figure 17:
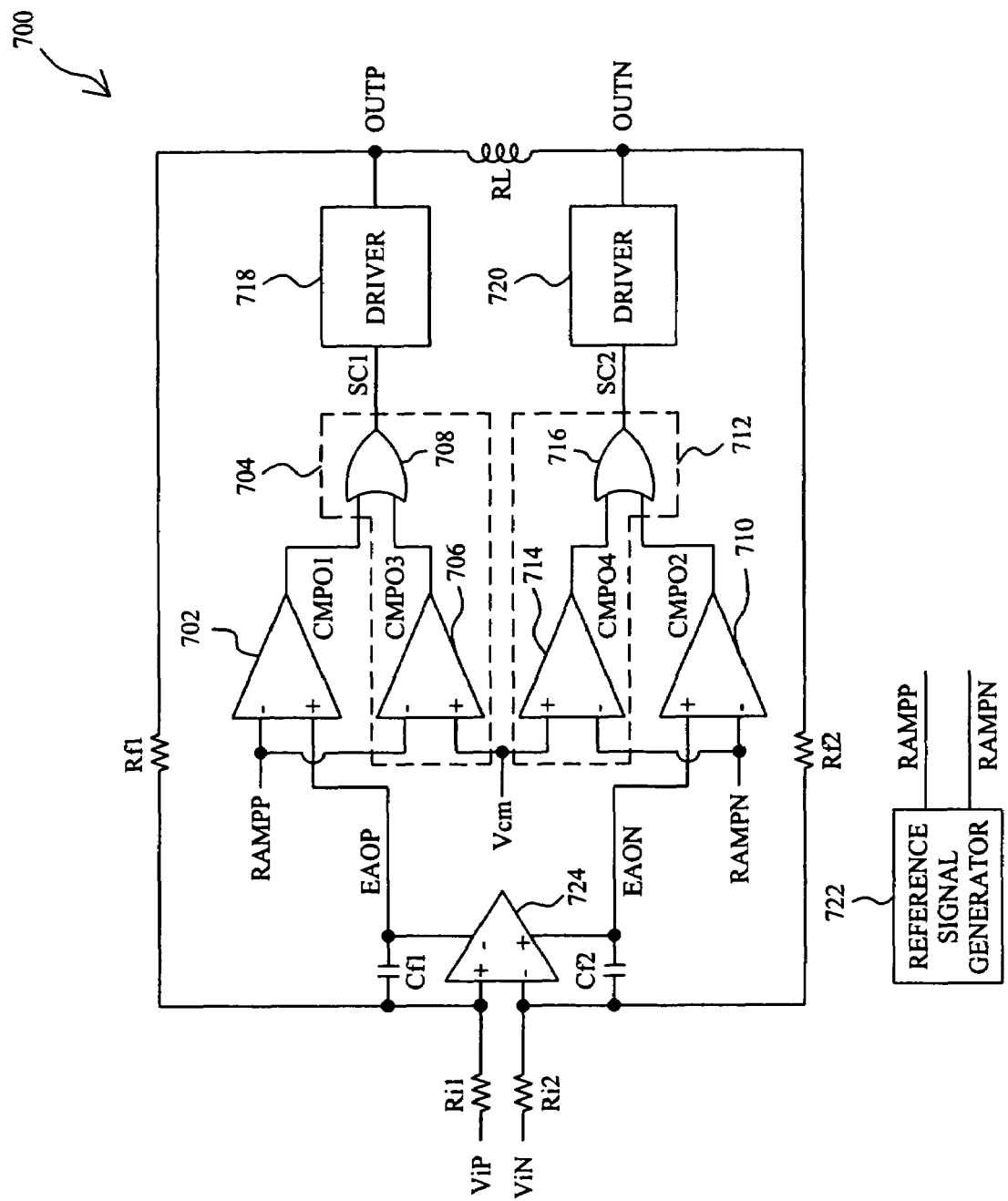
FIG. 17 shows a switching amplifier using the control circuit shown in FIG. 14 in association with negative-feedback configuration.

Similarly, in order to reduce distortion, as shown in FIG. 17, a fully-differential error amplifier 724 can be inserted between the pair of input signals ViP and ViN and the pair of comparators 702 and 710 of the control circuit 500 shown in FIG. 14 to form negative-feedback configuration. A resistor Ri1 is connected between the input signal ViP and the non-inverting input of the error amplifier 724, a resistor Ri2 is connected between the input signal ViN and the inverting input of the error amplifier 724, a capacitor Cf1 is connected between the non-inverting input and negative output of the error amplifier 724, a capacitor Cf2 is connected between the inverting input and positive output of the error amplifier 724, a resistor Rf1 is connected between the output signal OUTP and the non-inverting input of the error amplifier 724, a resistor Rf2 is connected between the output signal OUTN and the inverting input of the error amplifier 724, and the error amplifier 724 generates signals EAOP and EAON for the comparators 702 and 710 in response to the difference between the signals ViP and OUTP and the difference between the signals ViN and OUTN.

In all the illustrated embodiments, the application for filterless switching amplifier is explained; however, the control circuit and method of the present invention is equally applicable to the switching amplifier having LPF.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A control circuit for switching an H-bridge circuit in a switching amplifier to generate a first output signal and a second output signal, said control circuit comprising:
a first comparator for comparing a first input signal with a first reference signal to generate a first comparison signal;
a first logic control circuit in response to said first reference signal, a reference value and said first comparison signal for generating a first control signal;
a second comparator for comparing a second input signal 180-degree out of phase to said first input signal, with a second reference signal to generate a second comparison signal; and
a second logic control circuit in response to said second reference signal, reference value and second comparison signal for generating a second control signal;
wherein said first and second control signals switch said H-bridge circuit to generate said first and second output signals.

2. The control circuit of claim 1, wherein said reference value is an average of said first and second input signals.

3. The control circuit of claim 1, wherein said first logic control circuit comprises:
a third comparator for comparing said first reference signal with said reference value to generate a third comparison signal; and an OR gate in response to said first and third comparison signals for determining said first control signal.

4. The control circuit of claim 1, wherein said second logic control circuit comprises:
- a third comparator for comparing said second reference signal with said reference value to generate a third comparison signal; and
- an OR gate in response to said second and third comparison signals for determining said second control signal.

5. The control circuit of claim 1, further comprising a reference signal generator for providing said first and second reference signals.

6. A control method for switching an H-bridge circuit in a switching amplifier to generate a first output signal and a second output signal, said control method comprising the steps of:
- comparing a first input signal with a first reference signal for generating a first comparison signal;
- generating a first control signal in response to said first reference signal, a reference value and said first comparison signal;
- comparing a second input signal out of phase to said first input signal, with a second reference signal for generating a second comparison signal; and
- generating a second control signal in response to said second reference signal, reference value and second comparison signal;
- wherein said first and second control signals switch said H-bridge circuit to generate said first and second output signals.

7. The control method of claim 6, wherein said reference value is an average of said first and second input signals.

8. The control method of claim 6, wherein the step of generating a first control signal comprises the steps of:
- comparing said first reference signal with said reference value for generating a third comparison signal; and
- generating said first control signal in response to said first and third comparison signals.

9. The control method of claim 6, wherein the step of generating a second control signal comprises the steps of:
- comparing said second reference signal with said reference value for generating a third comparison signal; and
- generating said second control signal in response to said second and third comparison signals.

* * * * *